(12) United States Patent
Han et al.

(10) Patent No.: US 9,035,727 B2
(45) Date of Patent: May 19, 2015

(54) FREQUENCY-TUNABLE FILTER

(75) Inventors: Sang-Ho Han, Incheon-si (KR);
Sung-Hwan Yun, Incheon-si (KR);
Eui-Jae Jung, Incheon-si (KR)

(73) Assignee: Ace Technologies Corporation, Seoul (KR)

( * ) Notice: Subject to any disclaimer, the term of this patent is extended or adjusted under 35 U.S.C. 154(b) by 467 days.

(21) Appl. No.: 13/380,319

(22) PCT Filed: Jun. 22, 2010

(86) PCT No.: PCT/KR2010/004053
§ 371 (c)(1),
(2), (4) Date: Dec. 22, 2011

(87) PCT Pub. No.: WO2010/151034
PCT Pub. Date: Dec. 29, 2010

(65) Prior Publication Data
US 2012/0098613 A1 Apr. 26, 2012

(30) Foreign Application Priority Data
Jun. 22, 2009 (KR) .................. 10-2009-0055415

(51) Int. Cl.
*H01P 1/205* (2006.01)
*H01P 7/04* (2006.01)
*H01P 1/208* (2006.01)
*H03J 1/00* (2006.01)

(52) U.S. Cl.
CPC ............ *H01P 1/2084* (2013.01); *H01P 1/2053* (2013.01); *H03J 1/0008* (2013.01)

(58) Field of Classification Search
CPC ......... H01P 1/20; H01P 1/208; H01P 1/2084; H01P 1/205; H01P 7/04; H03J 1/0008
USPC .................. 333/17.1, 203, 224, 231–233, 235
See application file for complete search history.

(56) References Cited

U.S. PATENT DOCUMENTS 7,205,868 B2 * 4/2007 Park et al. ............... 333/203
7,352,264 B2 * 4/2008 Schwab et al. ............... 333/203
8,179,212 B2 * 5/2012 Seo et al. ............... 333/203
2009/0058563 A1 3/2009 Seo et al.

FOREIGN PATENT DOCUMENTS

| KR | 10-0614565 B1 | 8/2006 |
| KR | 10-0816808 B1 | 3/2008 |
| KR | 10-2008-0088118 A | 10/2008 |
| KR | 10-2009-0021773 A | 3/2009 |

* cited by examiner

*Primary Examiner* — Benny Lee
*Assistant Examiner* — Jorge Salazar, Jr.
(74) *Attorney, Agent, or Firm* — TechLaw LLP

(57) ABSTRACT

A frequency tunable filter is disclosed. The frequency tunable filter includes a filter unit that can tune a frequency band of a frequency signal being filtered, a communication module that receives a control signal for controlling the tuning of the frequency band, and a control unit that controls the tuning of the frequency band based on the control signals. The disclosed filter can control the tuning of the filter's frequency band wirelessly.

5 Claims, 6 Drawing Sheets

FREQUENCY-TUNABLE FILTER

TECHNICAL FIELD

The present invention relates to a filter, more particularly to a tunable filter capable of controlling changes in the filter's frequency characteristics such as center frequency and bandwidth.

BACKGROUND ART

A filter is an apparatus for letting only signals of specific frequency bands pass (filtering), and is implemented in a variety of forms. Band-pass frequency of an RF (radio frequency) filter is determined by the filter's inductance and capacitance characteristics, and the operation of adjusting the filter's band-pass frequency is called tuning.

Arbitrary frequency bands are assigned to those doing business with communication systems such as mobile communication systems, and the communication operators divide the assigned frequency bands into several channels for use. In the case of the related art, communication operators produced a filter suited to each frequency band separately for use.

In recent times, however, with the rapid changes in the communication environment, there arose a need for such characteristics as center frequency and bandwidth to vary, unlike the environment in the early years of using mounted filters. A tunable filter is used for varying such characteristics.

FIG. 1 is a drawing illustrating a conventional filter's structure.

Referring to FIG. 1, the conventional filter comprises a housing 110, an input connector 120, an output connector 130, a cover 140, multiple cavities 150, and resonators 160.

Inside the housing 110 there are multiple walls, by which each of the cavities 150 that hold resonators is defined. The cover 140 is equipped with joining holes and tuning bolts 170 for joining the housing 110 and the cover 140.

The tuning bolts 170 are joined to the cover and penetrate into the inside of the housing. The tuning bolts 170 are placed on the cover 140 in positions corresponding to the resonators or to designated positions inside the cavities.

RF signals (or frequency signals) are input to the input connector 120 and output to the output connector 130, and they proceed to the subsequent cavity 150 through the coupling window in each cavity 150. Each of the cavities 150 and resonators 160 cause resonance in the RF signals, and the RF signals are filtered by this resonance phenomenon.

In a conventional filter such as that of FIG. 1, the tuning of frequency characteristics such as center frequency and bandwidth are carried out by way of tuning bolts 170.

FIG. 2 is a cross-sectional view of a cavity in a conventional filter.

Referring to FIG. 2, the tuning bolt 170 goes through the cover 140, and is located above the resonator 160. The tuning bolt 170 is composed of a metal, and is secured to the cover 140 by screw-joining.

Consequently, by rotating the tuning bolt 170, the distance between it and the resonator 160 may be adjusted, and tuning is achieved by varying the distance between the resonator 160 and the tuning bolt 170. The tuning bolt 170 may be rotated manually, or a separate tuning machine may be used for the rotating of the tuning bolt. Once tuning is achieved at a suitable position, the tuning bolt 170 is secured by a nut.

In a conventional filter, as the distance between the tuning bolt 170 and the resonator 160 changes with the rotating of the tuning bolt 170, capacitance also changes. Capacitance is one of the parameters that determine the filter's frequency, and the filter's center frequency changes with the change in capacitance.

In such a conventional filter, tuning was only possible at the early phase of production, its structure making it difficult for tuning during use. To solve such a problem, a tunable filter that enables comparatively easier tuning by a sliding method was proposed.

The sliding-method frequency tunable filter performs tuning of frequency band characteristics such as the filter's resonance frequency and bandwidth by the sliding motion of a sliding part, installed to slide between the cover 140 and the resonator 160, and having a tuning element made of a metallic or a dielectric material attached to its underside. The sliding part may be slid automatically by the use of a motor, or manually by a user.

A tunable filter using such sliding method has the advantage of making tuning possible just by moving the sliding part sideways without the user having to rotate the tuning bolt.

However, even with a tunable filter using a sliding part, a user had to slide the sliding part manually by personally visiting the area where the tunable filter is installed, or manually control the motor for sliding the sliding part, in order to change the filter's frequency characteristics. Consequently, if the tunable filter was installed in a remote area with little accessibility, such as in a mountainous region, there was a problem of the tuning of the filter's frequency characteristics being bothersome and time-consuming

DISCLOSURE

Technical Problem

An embodiment of the invention provides a frequency tunable filter for which the tuning of frequency bands can be controlled wirelessly.

Another objective of the present invention is to provide a frequency tunable filter using a sliding method with which the tuning of the filter's frequency bands can be controlled based on control signals transmitted from a remote site.

Technical Solution

To achieve the objectives above, an aspect of the invention provides a frequency tunable filter that includes: a filter unit that can tune a frequency band of a frequency signal being filtered; a communication module that receives a control signal for controlling the tuning of the frequency band; and a control unit that controls the tuning of the frequency band based on the control signals.

Another aspect of the present invention provides a frequency tunable filter that includes: a housing, in which multiple cavities are defined by partition walls; a resonator contained in the cavity; at least one sliding part installed above the resonator; a tuning element joined to a lower portion of the sliding part; a main cover joined to an upper portion of the housing; a communication module that receives a control signal for controlling a sliding of the sliding part; and a processor that determines a sliding distance of the sliding part based on the control signal; where the frequency band being filtered is tuned according to the sliding distance of the sliding part.

Advantageous Effects

According to certain embodiments of the present invention, the tuning range of a filter may be changed by means of control signals transmitted from a remote site.

MODE FOR INVENTION

Figure 1:
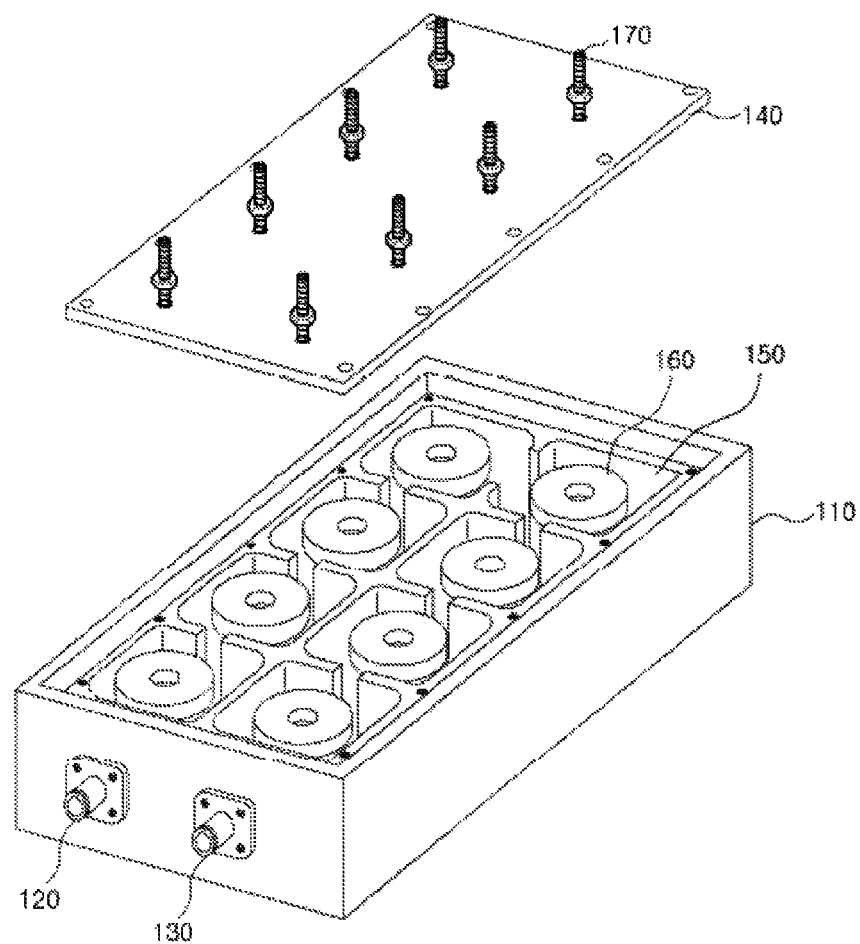
FIG. 1 is a drawing illustrating a conventional filter's structure.
Figure 2:
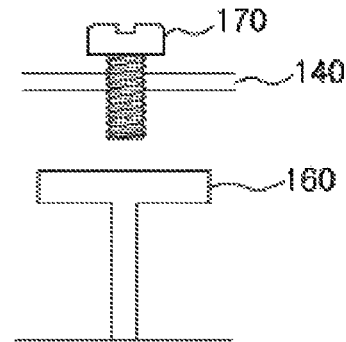
FIG. 2 is a cross-sectional view illustrating a cavity in a conventional filter.

Certain preferred embodiments of the invention will be described below in more detail with reference to the accompanying drawings. For the sake of easier understanding, those components that are the same or are in correspondence are rendered the same reference numeral regardless of the figure number.

Figure 3:
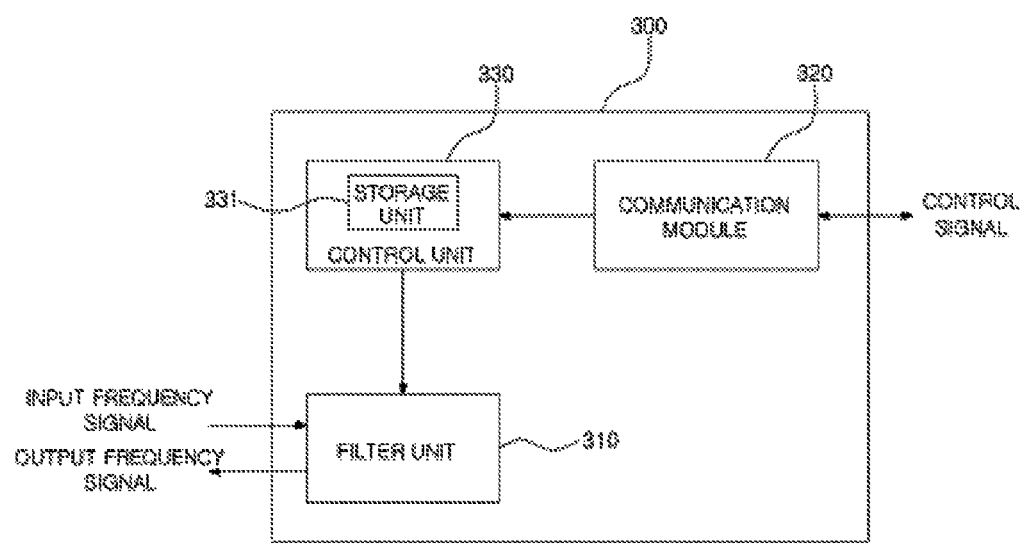
FIG. 3 is a block diagram illustrating the detailed composition of a frequency tunable filter according to an embodiment of the present invention.

FIG. 3 is a block diagram illustrating detailed composition of a frequency tunable filter according to an embodiment of the present invention.

A frequency tunable filter 300 according to an embodiment of the present invention may include a filter unit 310, a communication module 320, and a control unit 330. The functions of each component part will be described below.

The filter unit 310 passes signals of specific frequency band, out of all input frequency signals. Here, the frequency band being filtered is tunable.

The communication module 320 receives control signals for controlling the tuning of the frequency band, and the control unit 330 controls the tuning of the frequency band based on the received control signals.

In this case, the control signals may be signals transmitted from a control server installed in a remote site, that is, an area far away from where the frequency tunable filter 300 is installed.

In other words, if the frequency tunable filter 300 is installed in a remote area that is inaccessible, as mentioned earlier, there used to exist the inconvenience of an administrator having to personally visit the area where the frequency tunable filter is installed and to perform a tuning operation. However, if the frequency tunable filter 300 according to an embodiment of the present invention is used, the administrator only has to generate control signals for controlling the tuning of the frequency band from a remote site and to transmit them to the frequency tunable filter 300, thus easily tuning the frequency band of the frequency tunable filter 300.

Here, the control unit 330 may control the tuning of the frequency band by changing the structure of the filter unit 310.

For example, if the filter unit 310 is structured to include the sliding part mentioned earlier, the structural change of the filter unit 310 may correspond to a change in sliding distance of the sliding part, and the control unit 330 may control the tuning of the frequency band by controlling the sliding distance of the sliding part.

According to an embodiment of the present invention, the control unit 330 may include a storage unit that stores at least first information regarding the structure of the filter unit 310 and second information regarding the frequency band's characteristics in correspondence with each other. In other words, the storage unit 331 matches the structure of the filter unit 310 and the frequency band of the filter unit 310 and stores them.

In this case, the control unit 330 may change the structure of the filter unit 310 by using the information stored at the storage unit 331 and the control signals received.

In other words, when the control signals including frequency band information (second information) regarding the frequency band that the administrator is trying to filter is transmitted to the frequency tunable filter 300, the control unit 330 searches in the storage unit 331 for information regarding the frequency band's characteristics (second information) identical to the frequency band information included in the control signals, and reads out from the storage unit 331 the structure information (first information) of the filter unit 310 stored there in correspondence to the searched frequency band information.

Afterward, the control unit 330 changes the structure of the filter unit 310 according to the structure information (first information) of the filter unit 310 that was read out. Thus, the tuning of the frequency band is achieved.

According to another embodiment of the present invention, the control signals may include first information regarding the structure of the filter unit 310, and the control unit 330 may change the structure of the filter unit 310 based on the first information.

For example, in the case where the filter unit 310 performs filtering using the sliding part, if the administrator already knows the characteristics of the frequency band according to the sliding distance (extent of sliding) of the sliding part, the administrator may include the information regarding the sliding distance (first information) itself in the control signals, transmitting it to the frequency tunable filter 300. The frequency tunable filter 300 that receives the control signals may perform the tuning of the frequency band by changing the sliding distance according to the information regarding the sliding distance (first information).

The operation of tuning a frequency tunable filter equipped with a filter unit 310 that includes a sliding part will be described below in detail, with reference to FIG. 4.

Figure 4:
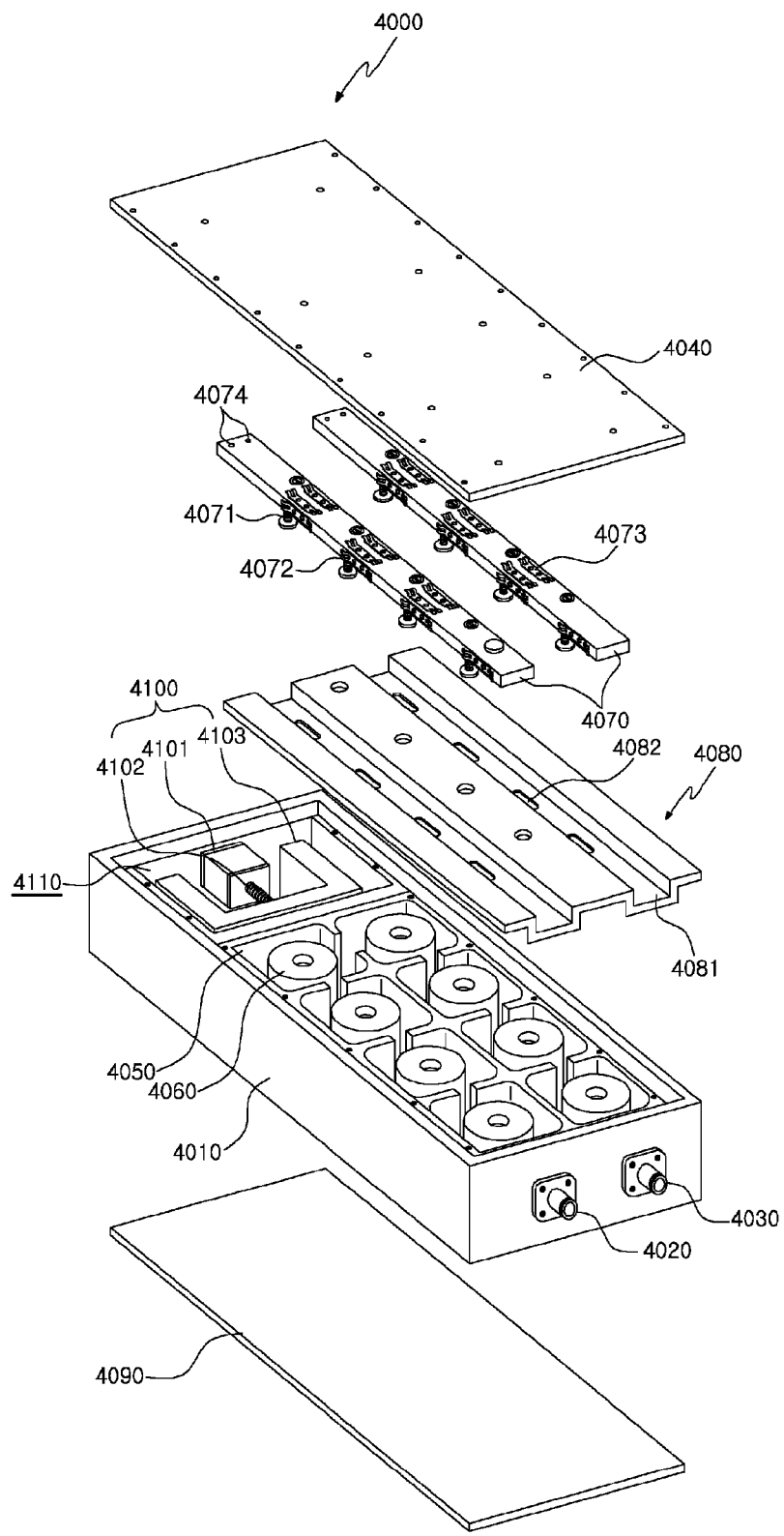
FIG. 4 is an exploded perspective view illustrating a frequency tunable filter using the sliding method according to an embodiment of the present invention.

FIG. 4 is an exploded perspective view illustrating a frequency tunable filter using the sliding method according to an embodiment of the present invention.

A frequency tunable filter using the sliding 5 method according to an embodiment of the present invention may include a housing 4010, an input connector 4020, an output connector 4030, a main cover 4040, multiple cavities 4050, multiple resonators 4060, sliding parts 4070, a sub-cover 4080, a driving unit 4100, and a circuit board 4090.

The housing 4010 serves to protect the component parts inside the filter, such as the resonators, and to provide shielding from electromagnetic waves.

The housing 4010 may include a base composed of aluminum and finished with plating. Usually, for RF equipment such as filters and waveguides, silver-plating is used in order to minimize loss, as this provides excellent conductivity. In recent times, other types of plating are also being used to improve such characteristics as corrosion resistance, and a housing finished with such plating types may also be used.

Inside the frequency tunable filter 4000, there are multiple partition walls, and such partition walls, together with the housing 4010, define the cavities 4050 in which the resonators 4060 are contained.

The number of cavities 4050 and of resonators 4060 is related to the order of the filter, and FIG. 4 illustrates a case wherein the order is 8, that is, there are eight resonators. The order of the filter is related to skirt characteristics and insertion loss. Here, the skirt characteristics and insertion loss form a trade-off relationship. In other words, a higher order of the filter leads to better skirting characteristics, but worse insertion loss. Consequently, the order of the filter (that is, the number of cavities 4050 and of resonators 4060) is determined by the skirting characteristics and insertion loss required.

Some of the partition walls have coupling windows corresponding to the proceeding direction of RF signals (or frequency signals). RF signals resonated by the cavities 4050 and resonators 4060 proceed to the next cavity through the coupling window.

The main cover 4040 and the sub-cover 4080 are joined to an upper portion of the housing 4010, and may be joined to the housing 4010 by screw-joints applied to multiple fastening holes. The sub-cover 4080 includes guide grooves 4081 so that the sliding parts 4070 may slide in a stable manner.

The sliding parts 4070 are installed so as to slide along a direction orthogonal to the direction in which the resonators 4060 stand, that is, along a horizontal direction. In this case, the sliding parts 4070 are installed in the guide grooves 4081 formed in an upper portion of the sub-cover 4080.

The number of sliding parts may correspond to the number of lines of resonators in the filter. FIG. 4 illustrates a filter having two lines of resonators, each of which has four resonators, and correspondingly, the number of sliding parts 4070 is shown to be two.

Tuning elements 4071 are joined to a lower portion of the sliding part 4070. The tuning elements 4070 go through elongated holes 4082 in the sub-cover 4080 into the interior of the filter. The tuning elements 4071 are composed of a metallic or dielectric material, preferably metallic. On the other hand, the sliding parts 4070 should be preferably composed of a dielectric material.

The tuning elements 4071 are joined to a lower portion of the sliding parts 4070, with each resonator being equipped with a corresponding tuning element. Under each sliding part 4070 there are four resonators, and hence, four tuning elements are joined to each sliding part 4070. Also, the distance at which the tuning elements are joined corresponds to the distance at which the resonators 4060 are installed.

The positions of the tuning elements 4071 joined in correspondence with the sliding of the sliding parts 4070 may also vary. The tuning elements 4071 form capacitance through interaction with the resonators 4060, and when the positions of the tuning elements 4071 change, the capacitance also changes.

As capacitance is determined by the distance between two metallic objects and their overlap area, the overlap area between a resonator and a tuning element changes with varying position of the tuning element composed of a metallic material, and accordingly, the capacitance can be varied, making it possible to tune the filter.

The tuning operation of a filter according to the sliding of a sliding part will be described below in more detail, with reference to FIG. 5.

Figure 5:
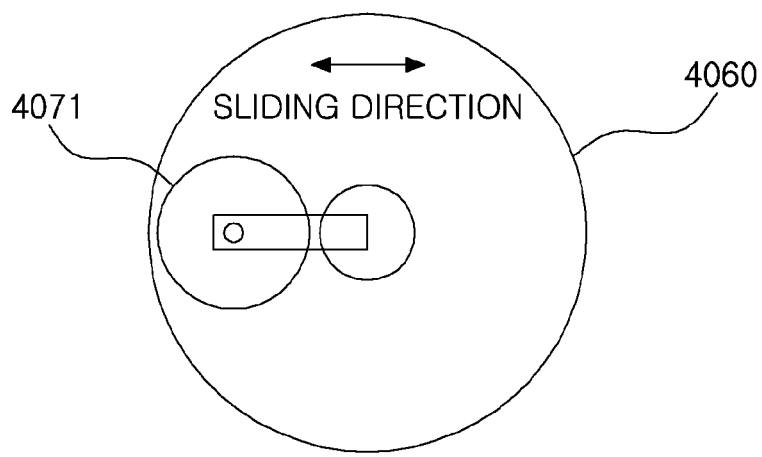
FIG. 5 is a drawing for explaining how the area of cross-section overlap between a tuning element and a resonator changes according to the sliding of the sliding part.

FIG. 5 is a drawing for explaining how the area of cross-section overlap between a tuning element and a resonator changes according to the sliding of the sliding part.

As the sliding part 4070 slides, the tuning elements 4071 joined to the sliding part also slide. As the tuning elements 4071 move, the overlapping area between the upper portions of the resonators 4060 and the tuning elements 4071 changes, and accordingly, the value of capacitance also changes.

In FIGS. 4 and 5, the resonators 4060 are shown to be disc-shaped and the tuning elements 4071 are shown to be discus-shaped, but this is merely one example, and the resonators 4060 and tuning elements 4071 may be implemented in a variety of shapes.

A frequency tunable filter 4000 according to an embodiment of the present invention will be described below in more detail with reference to FIG. 4.

Multiple first guide parts 4072 may be joined to one side of the sliding part 4070, while multiple second guide parts 4073 may be joined to an upper portion of the sliding part 4070. The first guide parts 4072 and the second guide parts 4073 are joined in order to limit unnecessary movement of the sliding part 4070.

In other words, the sliding part 4070 should only slide along a lengthwise (longitudinal) direction, and any up-and-down or widthwise movement during sliding should be eliminated. For this purpose, the first guide part 4072 and the second guide part 4073 eliminate unnecessary movement up-and-down or widthwise, and enable the sliding part to slide only in the pre-designated direction.

In other words, the first guide part 4072 and the second guide part 4073 perform the function of guiding the sliding part 4070 to slide in a stable manner in the guide groove 4081 in an upper portion of the sub-cover 4080. In this case, the first guide part 4072 and the second guide part 4073 are composed of an elastic material, and may preferably be implemented as a flat spring.

In FIG. 4, the first guide parts 4072 are shown to be joined only on one side, but the first guide parts 4072 may be joined on both sides of the sliding part 4070.

Also, in FIG. 4, the sliding part 4070 is described as sliding on the guide groove in the sub-cover 4080, but the sliding part 4070 may also slide while installed directly between the main cover 4040 and the resonators 4060. In this case, the sub-cover 4080, the first guide part 4072, and the second guide part 4073 are not installed.

The circuit board 4090 receives control signals transmitted from a remote site, and uses the received control signals to control the sliding motion of the sliding part 4070.

As an example, a PCB (print circuit board) may be used for the circuit board 4090.

The structure of a circuit board 4090 according to an embodiment of the present invention will be described below in more detail with reference to FIG. 6.

Figure 6:
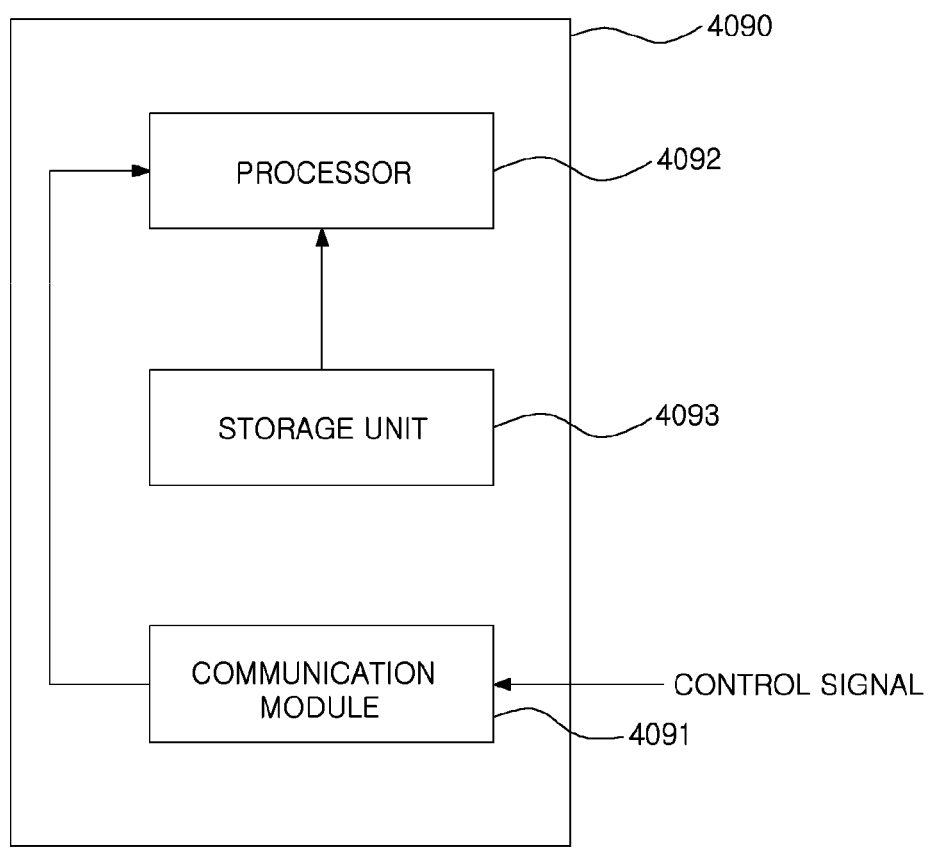
FIG. 6 is a block diagram illustrating the detailed composition of a circuit board according to an embodiment of the present invention.

FIG. 6 is a block diagram illustrating the detailed composition of a circuit board according to an embodiment of the present invention.

According to an embodiment of the present invention, the circuit board 4090 may include a communication module 4091, a processor 4092, and a storage unit 4093.

The communication module 4091 receives control signals for controlling the sliding of the sliding part 4070. In this case, control signals may be those transmitted from a control server installed in a remote site.

As an example, the communication module may be an Ethernet module.

The processor 4092 determines the sliding distance of the sliding part 4070 based on the received control signals.

In other words, the processor 4092 changes the sliding distance of the sliding part 4070, in order to control the characteristics of the frequency band being filtered.

Here, the sliding distance may be the distance of the sliding part 4070 from its initial position, or its distance from a previous position. When the sliding distance is the distance of the sliding part 4070 from its initial position, the sliding part 4070 returns to its initial position at the initial point of frequency band tuning.

According to an embodiment of the present invention, the control signals may include information regarding the sliding distance. Here, the processor 4092 reads out from the control signals the information regarding the sliding distance, using this to determine the sliding distance of the sliding part 4070. In this case, the storage unit 4093 described below may not be installed on the circuit board 4090.

The storage unit 4093 stores at least first information regarding the sliding distance of the sliding part 4070 and second information regarding the characteristics of the frequency band of the frequency tunable filter 4000 in correspondence with each other.

In other words, the storage unit 4093 stores the correlational relationship between the sliding distance and the characteristics of the frequency band. The first and second information stored at the storage unit 4093 are used to determine the sliding distance of the sliding part 4070.

According to an embodiment of the present invention, the control signals may include second information regarding characteristics of the frequency band to be tuned. In this case, the processor 4092 may search in the storage unit 4093 for information identical to the second information included in the control signals, read out from the storage unit 4093 the first information corresponding to the second information found, and determine the sliding distance of the sliding part 4070 based on the read-out first information. The second information stored in the storage unit 4093 may be information regarding the center frequency of the frequency band.

For example, if the sliding distances of the sliding part 4070 are $d_1$ through $d_v$, and the center frequencies of the frequency band corresponding to these are $f_1$ through $f_v$, then the information is matched together as $(d_1, f_1), (d_1, f_2), \ldots, (d_v, f_v)$ and stored in the storage unit 4093.

Here, assuming that the center frequency of the frequency band included in the control signals is $f_4$, the processor 4092 reads out from the storage unit 4093 the sliding distance $d_4$ corresponding to $f_4$, and makes the sliding part 4070 slide as much as $d_4$.

Also, as illustrated in FIG. 4, a frequency tunable filter according to an embodiment of the present invention may further include a driving unit 4100.

The driving unit 4100 provides a driving force to the sliding part 4070. In other words, the sliding part 4070 is made to slide by the driving force provided at the driving unit 4100. Consequently, if a frequency tunable filter 4000 is structured with a driving unit 4100 included, the processor determines the distance of the sliding part 4070 by controlling the driving force provided by the driving unit 4100, and accordingly determines the tuning range of the frequency band.

Here, the driving unit 4100 is joined to the sliding part 4070 by way of two joining holes 4074 at one end of the sliding part 4070. In one example, the joining hole 4074 has a screw thread formed into it, and the driving unit 4100 and the sliding part 4070 may be joined by screw-joining.

According to a preferred embodiment of the present invention, the driving unit 4100 may include a motor 4101, a gear unit 4102, and an intermediary part 4103.

The structure of a driving unit 4100 according to an embodiment of the present invention will be described below in more detail with reference to FIGS. 4, 7, and 8.

Figure 7:
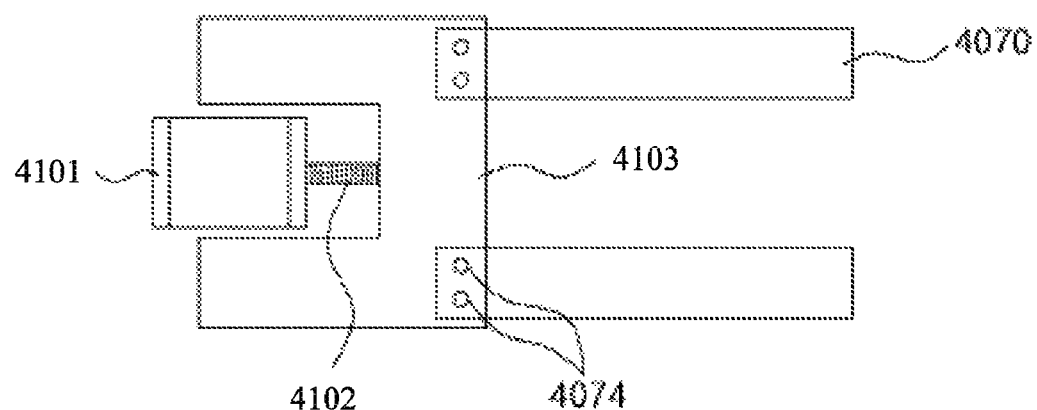
FIGS. 7 and 8 are drawings illustrating the joining of a sliding part and a driving unit according to an embodiment of the present invention.
Figure 8:
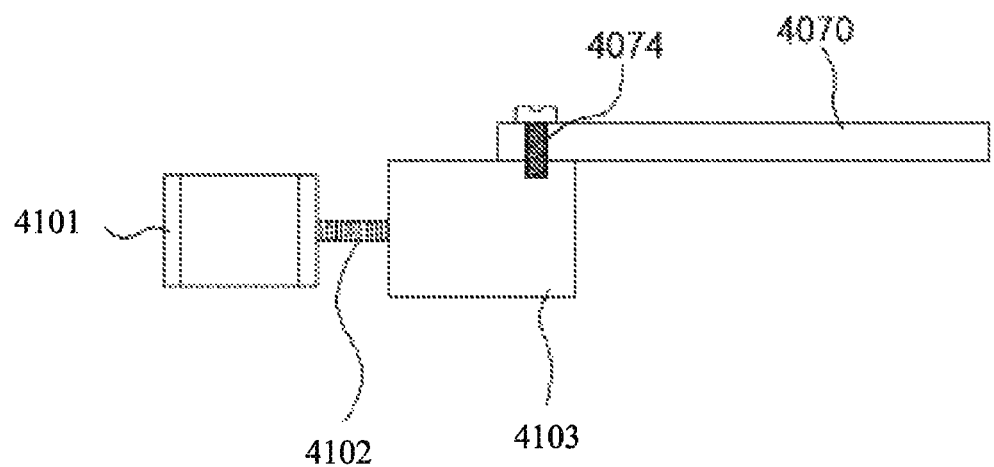

FIGS. 7 and 8 are drawings illustrating the joining of a sliding part and a driving unit according to an embodiment of the present invention.

The motor 4101 provides rotational force, and the rotational force of the motor 4101 is provided to the gear unit 4102.

The gear unit 4102 transforms the rotational motion into horizontal motion. The intermediary part 4103 is joined to the gear unit 4102 and the sliding part 4070, and provides the horizontal force to the sliding part 4070, causing the sliding part 4070 to slide. In other words, the intermediary part 4103 moves sideways horizontally, in correspondence with the rotation of the gear unit 4102.

Here, the intermediary part 4103 has a threaded hole (not shown) for joining the gear unit 4102 and joining holes 4074 for joining the sliding parts 4070. The joining holes 4074 have screw threads formed into them, and the intermediary part 4103 and the sliding part 4070 may be joined together by screw-joining. Of course, the joining method is not limited to screw-joining, and a variety of methods may be possible. Also, one end of the sliding part 4070 is joined to the intermediary part 4103, but the other end is not secured. This is for allowing free sliding.

In FIGS. 4, 7 and 8, the rotational motion of the motor is described as being transformed into a horizontal motion by the gear unit 4102 and the intermediary part 4103 and then transferred to the sliding parts 4070, but this is merely an example. So long as the motor's rotational motion may be transformed into a horizontal motion, the driving unit 4100 may include component parts other than a gear unit 4102 and an intermediary part 4103.

If the driving unit 4100 includes a motor 4101 as above, the processor 4092 may control the number of revolutions of the motor 4101, thus determining the sliding distance of the sliding part 4070.

Here, first information stored in the storage unit 4093 may be the number of revolutions of the motor. In other words, the first information regarding the number of revolutions of the motor 4101 and the second information regarding frequency band in correspondence with each other may be stored in the storage unit 4093. In this case, the processor 4092 reads out information regarding the number of revolutions of the motor (first information) that corresponds with the second information included in the control signals, and determines the number of revolutions of the motor 4101 based on this.

In one example, the number of revolutions of the motor 4101 may be the number of revolutions calculated from the initial position of the motor 4101 (that is, when the number of revolutions is "0"). In this case, the motor has to return to its initial position when tuning the frequency band.

In another example, the number of revolutions of the motor 4101 may be the number of revolutions calculated from the previous position of the motor 4101. In this case, the motor does not return to its initial position when tuning the frequency band.

The operation of storing first information regarding the number of revolutions of a motor and second information regarding center frequency of frequency band to be tuned, in correspondence with each other, in the storage unit 4093 will be described below in more detail with reference to FIG. 9.

Figure 9:
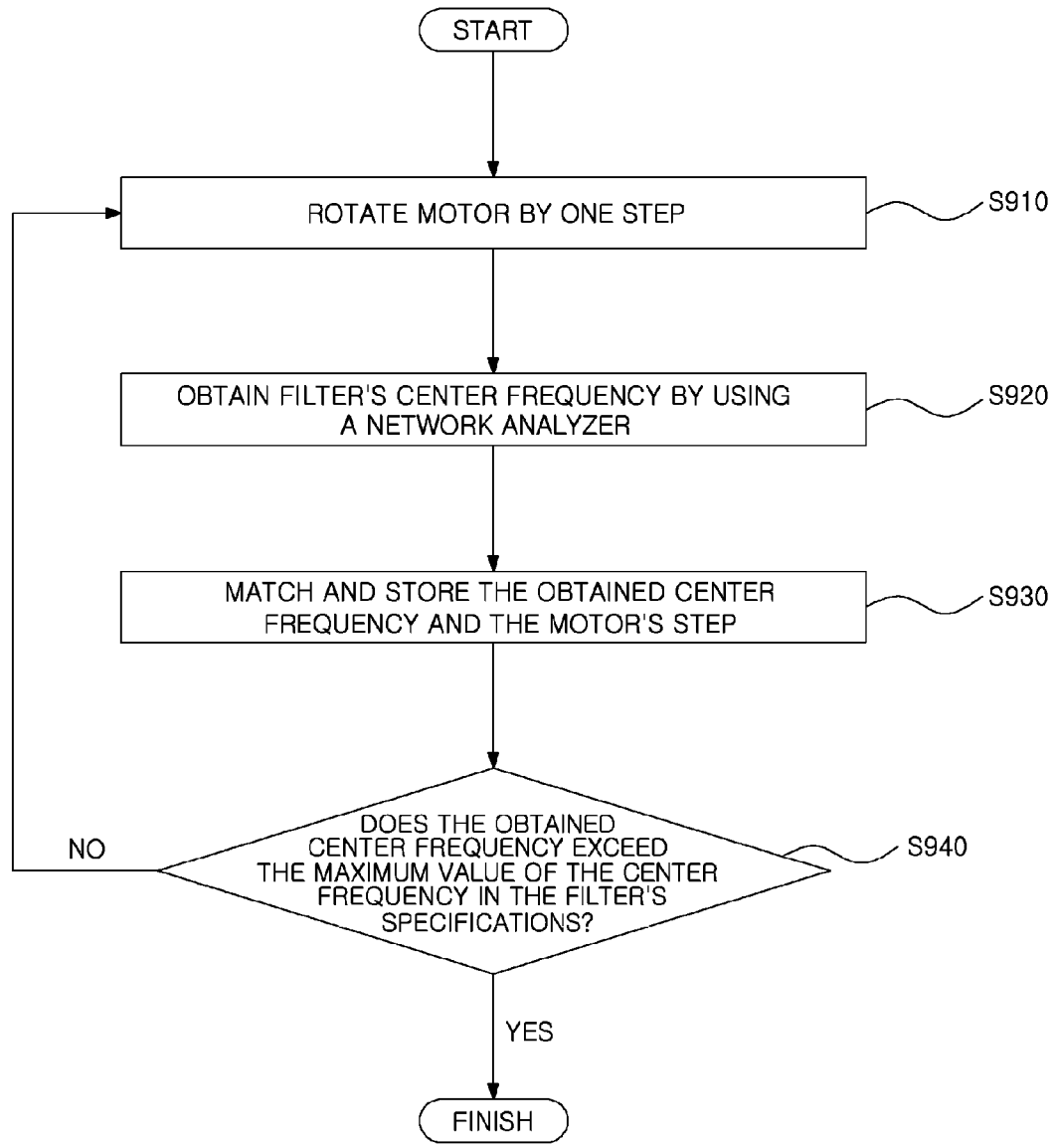
FIG. 9 is a flowchart illustrating the operation of storing first information and second information in correspondence with each other in the storage unit, according to an embodiment of the present invention.

FIG. 9 is a flowchart illustrating the operation of storing first information and second information in correspondence with each other in the storage unit 4093, according to an embodiment of the present invention.

Although not shown in FIG. 9, it is assumed that the number of revolutions of the motor 4091 is initialized in the initial phase of storing the first and second information.

First, in operation S910 the motor 4091 is rotated one step. Here, the rotation of the motor 4091 by one step may correspond to an arbitrary number of revolutions.

In operation S920 a network analyzer is used to obtain the filter's center frequency.

In operation S930 the obtained center frequency and the motor's step are matched and stored in the storage unit 4093.

In operation S940 it is verified whether the obtained center frequency exceeds the maximum value of the center frequency in the filter's specifications.

If the obtained center frequency does not exceed the maximum value of the center frequency of the filter's specifications, operations S910 through S930 are performed in repetition, and if the obtained center frequency exceeds the maximum value of the center frequency of the filter's specifications, the storing phase of the first and second information is completed.

Once again, a frequency tunable filter 4000 according to an embodiment of the present invention will be described in detail with reference to FIG. 4.

According to an embodiment of the present invention, control signals may include information regarding the number of revolutions of a motor itself. In this case, the processor 4092 extracts from the control signals the information regarding the number of revolutions of the motor, and uses this to determine the sliding distance of the sliding part 4070. In this case, the storage unit 4093 may not be installed on the circuit board 4090.

While FIG. 4 describes the driving unit 4100 as being installed in a space 4110 formed on one side of the interior of the housing 4010, it should be apparent to those skilled in the art that the driving unit 4100 may be installed at any position from which it can provide a driving force to the sliding part 4070.

Also, while FIGS. 4, 6, and 7 describe two sliding parts (that is, plural sliding parts) being joined to one intermediary part 4073, sliding together collectively, each of the plural sliding parts may also slide independently.

While the present invention has been described with reference to particular embodiments, the embodiments above are for illustrative purposes only and do not limit the invention. It is to be appreciated that various changes and modifications may be made by those skilled in the art without departing from the spirit and scope of the present invention, as defined by the appended claims and their equivalents. Such changes, modifications, and additions should be viewed as belonging to the scope of the invention as defined by the appended claims.

The invention claimed is:

1. A frequency tunable filter, comprising:
   a housing having multiple cavities defined by partition walls;
   a respective resonator contained in corresponding ones of the multiple cavities;
   at least one sliding part installed above the respective resonator of the corresponding cavity;
   a tuning element joined to a lower portion of the at least one sliding part;
   a main cover joined to an upper portion of the housing;
   a communication module configured to receive a control signal for controlling a movement of the at least one sliding part; and
   a processor configured to determine a sliding distance of the at least one sliding part based on the control signal;
   a storage unit configured to store information on sliding distances and information on characteristic of frequency bands such that a respective portion of the information on the sliding distances corresponds to each one of the frequency bands,
   wherein, the control signal includes information on characteristic of a frequency band for tuning, and the processor determines the sliding distance using the information on characteristic of the frequency band for tuning and information on sliding distances in correspondence with characteristic of the frequency bands.

2. The frequency tunable filter according to claim 1, wherein the information on characteristic of the frequency band for tuning includes a center frequency of the frequency band for tuning.

3. The frequency tunable filter according to claim 1, further comprising a driving unit configured to provide a driving force for moving the at least one sliding part, and wherein the processor determines the sliding distance of the at least one sliding part by controlling the driving force.

4. The frequency tunable filter according to claim 3, wherein the driving unit comprises:
   a motor;
   a gear unit configured to transform a rotational motion of the motor into horizontal motion; and
   an intermediary part joined to the gear unit and the at least one sliding part and configured to move the at least one sliding part by providing a horizontal moving force to the at least one sliding part.

5. The frequency tunable filter according to claim 4, wherein the processor determines the sliding distance of the at least one sliding part by adjusting a number of revolutions of the motor.

* * * * *